(12) United States Patent
Jin et al.

(10) Patent No.: US 10,715,151 B2
(45) Date of Patent: Jul. 14, 2020

(54) FAST COARSE TUNING FOR FREQUENCY SYNTHESIZER

(71) Applicant: QUALCOMM Incorporated, San Diego, CA (US)

(72) Inventors: Yuehai Jin, Laguna Hills, CA (US); Xinhua Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 104 days.

(21) Appl. No.: 15/933,204

(22) Filed: Mar. 22, 2018

(65) Prior Publication Data

US 2019/0296750 A1    Sep. 26, 2019

(51) Int. Cl.
| | |
|---|---|
| H03L 7/099 | (2006.01) |
| H03L 7/093 | (2006.01) |
| H03M 3/02 | (2006.01) |
| H03K 5/24 | (2006.01) |
| H03M 1/66 | (2006.01) |
| H03K 5/00 | (2006.01) |
| H04L 7/033 | (2006.01) |
| H04L 5/00 | (2006.01) |

(52) U.S. Cl.
CPC ......... *H03L 7/099* (2013.01); *H03K 5/00006* (2013.01); *H03K 5/24* (2013.01); *H03L 7/093* (2013.01); *H03M 1/66* (2013.01); *H03M 3/02* (2013.01); *H04L 5/0048* (2013.01); *H04L 7/0331* (2013.01)

(58) Field of Classification Search
CPC combination set(s) only.
See application file for complete search history.

(56) References Cited

U.S. PATENT DOCUMENTS

| | | | |
|---|---|---|---|
| 9,350,366 B2 | 5/2016 | Smith et al. | |
| 9,397,675 B1 | 7/2016 | Goodson et al. | |
| 9,484,936 B2 | 11/2016 | Waheed et al. | |
| 9,793,906 B1* | 10/2017 | Midha | H03L 7/083 |
| 2007/0194818 A1* | 8/2007 | Kim | H03L 7/107 |
| | | | 327/156 |
| 2009/0153252 A1* | 6/2009 | Chen | H03L 7/0891 |
| | | | 331/10 |
| 2013/0278303 A1* | 10/2013 | Chen | H03L 7/101 |
| | | | 327/117 |
| 2016/0182075 A1* | 6/2016 | Devarajan | H03M 1/1019 |
| | | | 341/120 |

FOREIGN PATENT DOCUMENTS

CN          107005244 A     8/2017

* cited by examiner

*Primary Examiner* — Jeffrey M Shin
(74) *Attorney, Agent, or Firm* — Seyfarth Shaw LLP

(57) ABSTRACT

A coarse tuning synthesizer for wireless communication includes a digital control unit, a digital-to-analog converter, and a comparator. The digital control unit includes an output node coupled to a first input node of a VCO (voltage controlled oscillator). The digital-to-analog converter includes a first node coupled to the first input node of the VCO. The comparator includes an output node coupled to an input node of the digital control unit. The comparator also includes a first input node coupled to a second node of the digital-to-analog converter and a second input node coupled to an output node of the VCO.

20 Claims, 8 Drawing Sheets

FAST COARSE TUNING FOR FREQUENCY SYNTHESIZER

TECHNICAL FIELD

The present disclosure generally relates to frequency synthesizers. More specifically, the present disclosure relates to fast coarse tuning for a frequency synthesizer.

BACKGROUND

A frequency synthesizer is a circuit that receives a reference signal at a reference frequency and generates an output signal at an output frequency. The output frequency may be related to the reference frequency by an integer ratio or a non-integer ratio, depending on the desired output frequency and the given reference frequency.

Frequency synthesizers are commonly used in various electronics devices. For example, a wireless device such as a cellular phone may include a frequency synthesizer to generate a local oscillator (LO) signal used for frequency downconversion or upconversion. A frequency synthesizer of a phase locked loop (PLL) type includes controlled oscillators such as voltage controlled oscillators (VCOs). An output of the VCO is often provided to a radio frequency (RF) mixer or to a microprocessor clock system. The frequency synthesizer controls the VCO such that its frequency or period is approximately equal to that of a stable frequency reference multiplied by a predetermined ratio. Coarse tuning systems compensate for variations in the VCO's frequency tuning range or center frequency by performing a coarse tuning of the tunable elements in the VCO. It is desirable to have as short as possible PLL coarse tune time in PLL normal operation.

SUMMARY

A coarse tuning synthesizer for wireless communication includes a digital control unit having an output node coupled to a first input node of a VCO (voltage controlled oscillator). The coarse tuning synthesizer also includes a digital-to-analog converter having a first node coupled to the first input node of the VCO. Further, the coarse tuning synthesizer includes a comparator comprising an output node coupled to an input node of the digital control unit, a first input node coupled to a second node of the digital-to-analog converter and a second input node coupled to an output node of the VCO.

A coarse tuning synthesizer for wireless communication includes means for generating a digital tuning code. The digital tuning code generating means is coupled to a first input node of a VCO (voltage controlled oscillator). The coarse tuning synthesizer also includes a digital-to-analog converter having a first node coupled to the first input node of the VCO. Further, the coarse tuning synthesizer includes a comparator comprising an output node coupled to the digital tuning code generating means, a first input node coupled to a second node of the digital-to-analog converter, and a second input node coupled to an output node of the VCO.

A coarse tuning method includes comparing a first voltage, based on a digital tuning code, to a closed loop tuning voltage from a low pass filter of a synthesizer. The method further includes digitally integrating an output generated from the comparing. Furthermore, the method includes updating the digital tuning code based on the integrating to change a coarse tuning frequency range of the VCO. A final updated digital tuning code corresponds to a coarse tuning frequency range closest to a target frequency.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
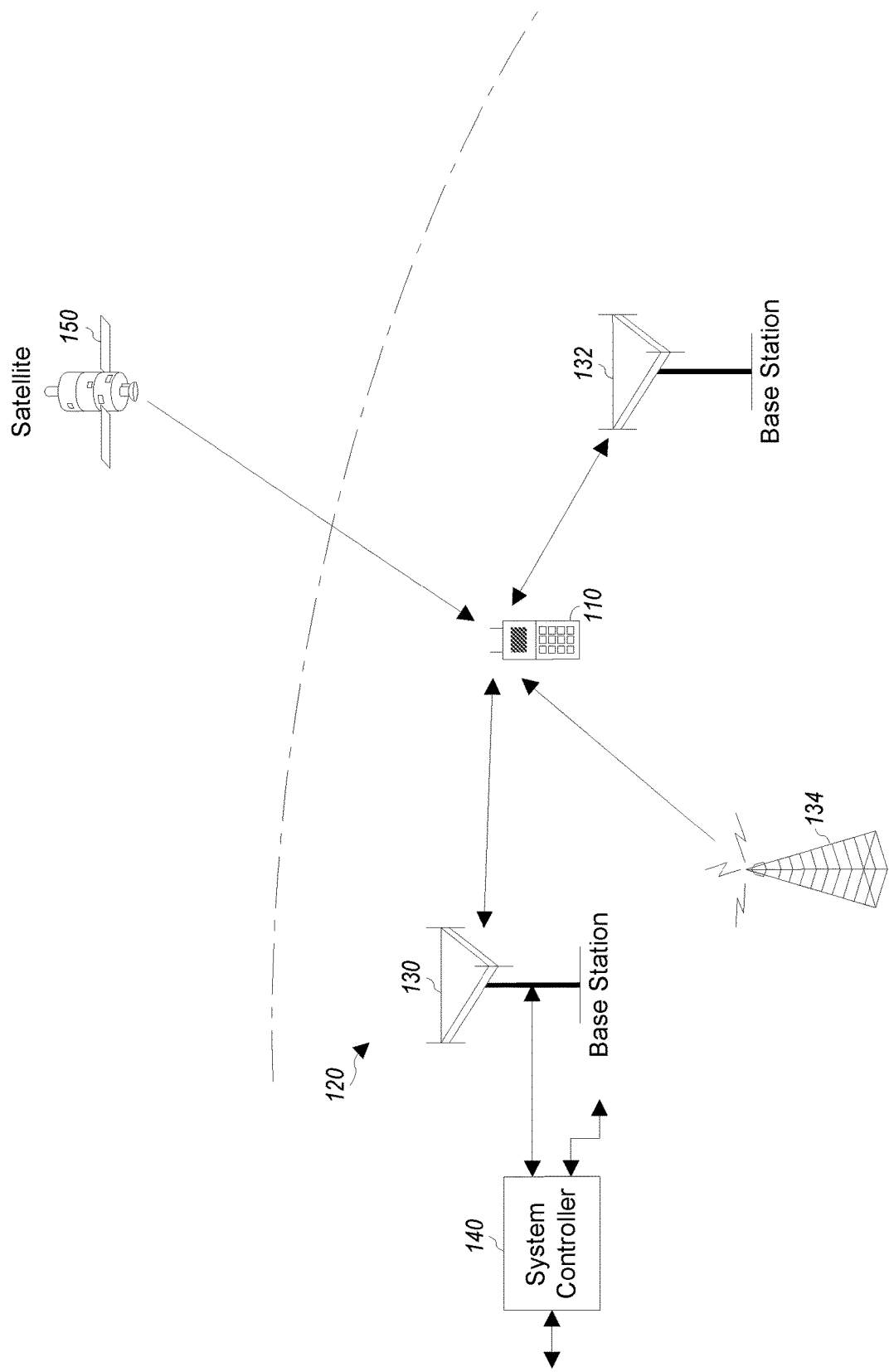
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A phase locked loop (PLL) type frequency synthesizer is often an important component of a device that is designed to operate in a wireless communication system. The PLL of the PLL type frequency synthesizer forces an oscillator (e.g., a voltage controlled oscillator (VCO), a digital controlled oscillator, a temperature controlled oscillator, or the like) to replicate and track a reference frequency and phase at an input when the PLL is in lock configuration. When locked, the frequencies of the input (e.g., a first phase detector input) and a second phase detector input are exactly tracked (e.g., second phase detector input=first phase detector input). The second phase detector input may be based on an output of the PLL (e.g., at a VCO), which tracks exactly at N times the frequency at an input of the PLL (e.g., at the first phase detector input). In one aspect, the phase detector compares the input frequency to an output of a counter whose input is the output frequency. A phase offset, however, may exist between the first phase detector input and the second phase detector input.

A PLL reference frequency may be derived from a local oscillator (e.g., a crystal oscillator (XO)). A frequency of the crystal oscillator may be around tens of megahertz (MHz) while a frequency of the VCO may be specified to generate a periodic signal in the gigahertz (GHz) range. A frequency divider by N is interposed between the VCO and the phase detector. When locked, the frequency at an output of the PLL (e.g., at a VCO) tracks exactly at N times the frequency at an input of the PLL (e.g., at the phase detector). For example, N*input frequency is equal to the output frequency. Thus, the output frequency of the VCO is set at a multiple (for integer-N PLL) of the frequency by the frequency divider. In the case of a fractional-N PLL, different divisional factors are used to obtain a fractional frequency. To ease tuning range specifications, VCOs are often designed to support a voltage input signal that includes both a coarse frequency tuning signal and a fine frequency tuning signal.

It is desirable to have as short as possible PLL coarse tune time (to find correct VCO frequency code) in PLL normal operation. For example, some PLL coarse tune times are specified to support PLL frequency hopping. These PLL coarse tune times for the PLL to settle may include speed specifications as short as two microseconds (2 μs) when the VCO frequency jumps by approximately one hundred megahertz (~100 MHz). To achieve this short settling time, some implementations use a VCO hopping bank. However, these implementations specify calibration to achieve accurate hopping frequency.

Phase locked loops or synthesizers have a very wide bandwidth to support different applications. For example, a synthesizer may have a frequency tuning range of two (2) to forty (40) GHz. Because of the many channels between 2-40 GHz, the synthesizer is specified to jump to any of the channels very fast. For example, systems (e.g., time division duplex (TDD) systems) are specified to quickly tune to different frequencies and return very fast to a current communication frequency. To tune and return very fast within this large tuning range, the combination of coarse tuning (e.g., discrete tuning) to reduce the tuning range and fine tuning within the reduced tuning range is desirable. For example, coarse tuning achieves fast jumping within discrete curves (illustrated in FIG. 5), in which each discrete curve includes a reduced tuning range. Fine tuning occurs to a fraction of the tuning range ((e.g., tens to hundreds of megahertz (MHz)). The combination of the coarse tuning and the fine tuning, according to aspects of the present disclosure, achieves the desirable settling time of the synthesizer.

Aspects of the present disclosure are directed to a coarse tuning (CT) method that quantizes an analog fine frequency tuning signal (Vtune) to a digital coarse tuning code. For example, the delta modulator may be implemented with a digital-to-analog converter (DAC), a comparator, and a digital control unit, among others. Some aspects of the coarse tuning methods include receiving, at the VCO, a digital tuning code or VCO frequency code that sets the VCO to an initial coarse tuning frequency range. The coarse tuning method further includes obtaining a first voltage (e.g., using the digital-to-analog converter) based on the digital tuning code and comparing (e.g., using a comparator) the first voltage to a closed loop tuning voltage of the PLL. The closed loop tuning voltage may be a voltage at an output of a low pass filter (LPF) of the PLL.

The coarse tuning method further includes digitally integrating an output of the comparator and updating the digital tuning code (or coarse tuning code) based on the integrating. For example, the integrating may include summing an output of the comparator with feedback of a current digital tuning code. For example, the feedback of the current digital tuning code may originate from an output of flip-flops included in the digital control unit. The output of the digital control unit is also coupled to an input of the VCO. The digital tuning code is updated to change the coarse tuning frequency range of the VCO. The updating of the digital tuning code continues until a final updated digital tuning code is achieved. For example, the digital tuning code is continuously passed to the VCO and the digital tuning code is continuously updated from the digital top.

The final updated digital tuning code corresponds to a coarse tuning frequency range closest to a target frequency to be output by the VCO. For example, the target frequency may be controlled by changing an effective division ratio "N", where N has an integer and fractional bits. The ratio may be generated by a frequency divider. In some implementations, an output frequency from the VCO is generated based on the digital tuning code, a fixed voltage bias, and the closed loop tuning voltage. The fixed voltage bias may be provided to the VCO from a fixed voltage bias device such as a mid-voltage generator (MVG).

These new coarse tuning methods depend on wide bandwidth and fast converging properties of the PLL. For example, the coarse tuning methods depend on the PLL loop to obtain coarse tuning convergence. These coarse tuning methods can eliminate the need for some hardware (e.g., an analog counter and a digital engine for digital counter based coarse tuning), while achieving faster settling time. Moreover, the new coarse tuning methods provide a way to implement fast frequency hopping with limited hardware, software, and timeline overhead.

Figure 8:
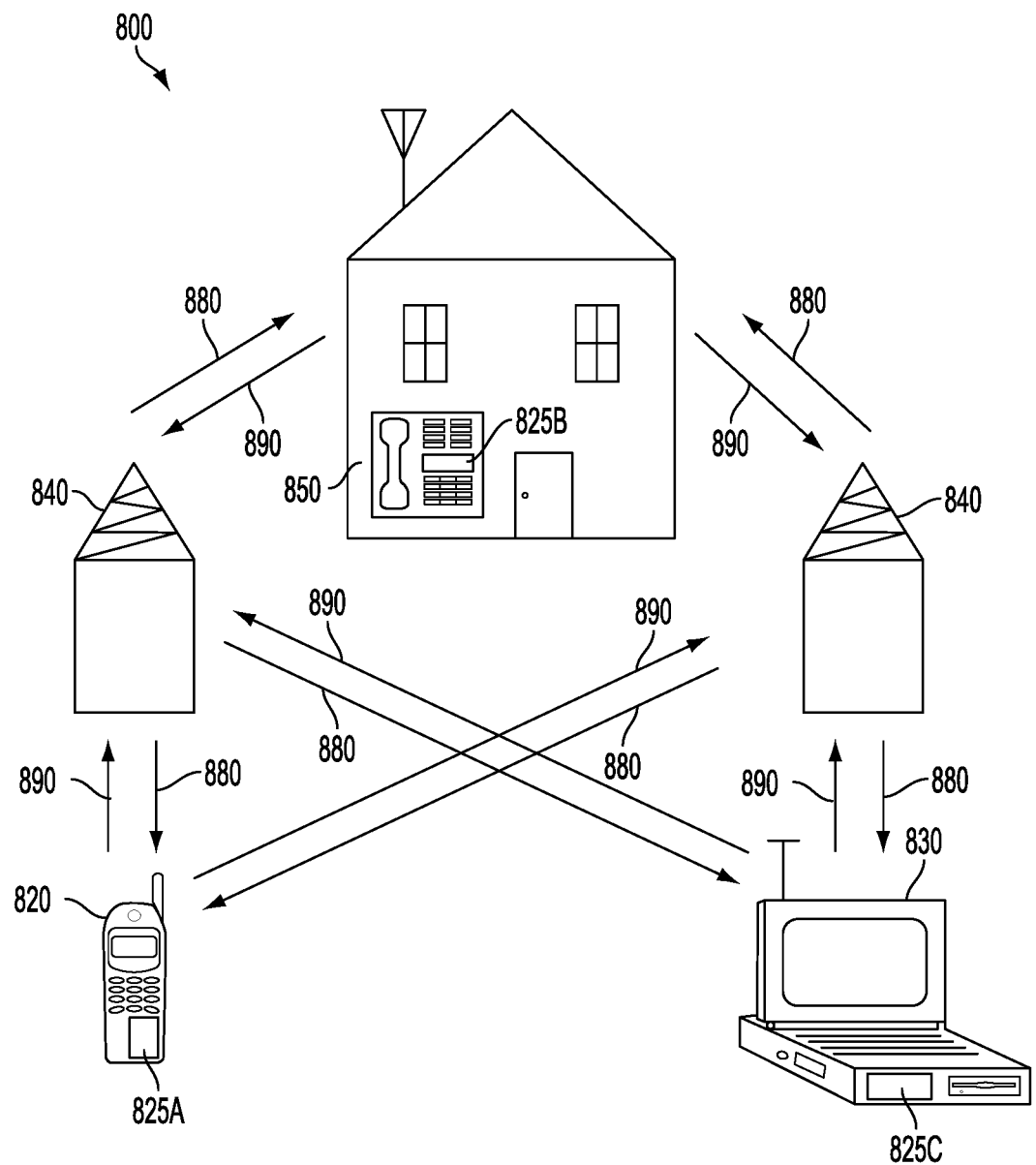
FIG. 8 is a block diagram showing an exemplary wireless communication system in which a configuration of the disclosure may be advantageously employed.

The aspects of the present disclosure may be implemented in the system of FIGS. 1 and 8. More specifically, aspects of the present disclosure may be implemented in the wireless device of FIG. 2 and/or in the PLL of FIG. 3.

FIG. 1 shows a wireless device 110, including a synthesizer or PLL, communicating with a wireless communication system 120. The wireless communication system 120 may be a 5G system, a long-term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 MHz, mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five (5) carriers in one or two bands in LTE Release 11.

Figure 2:
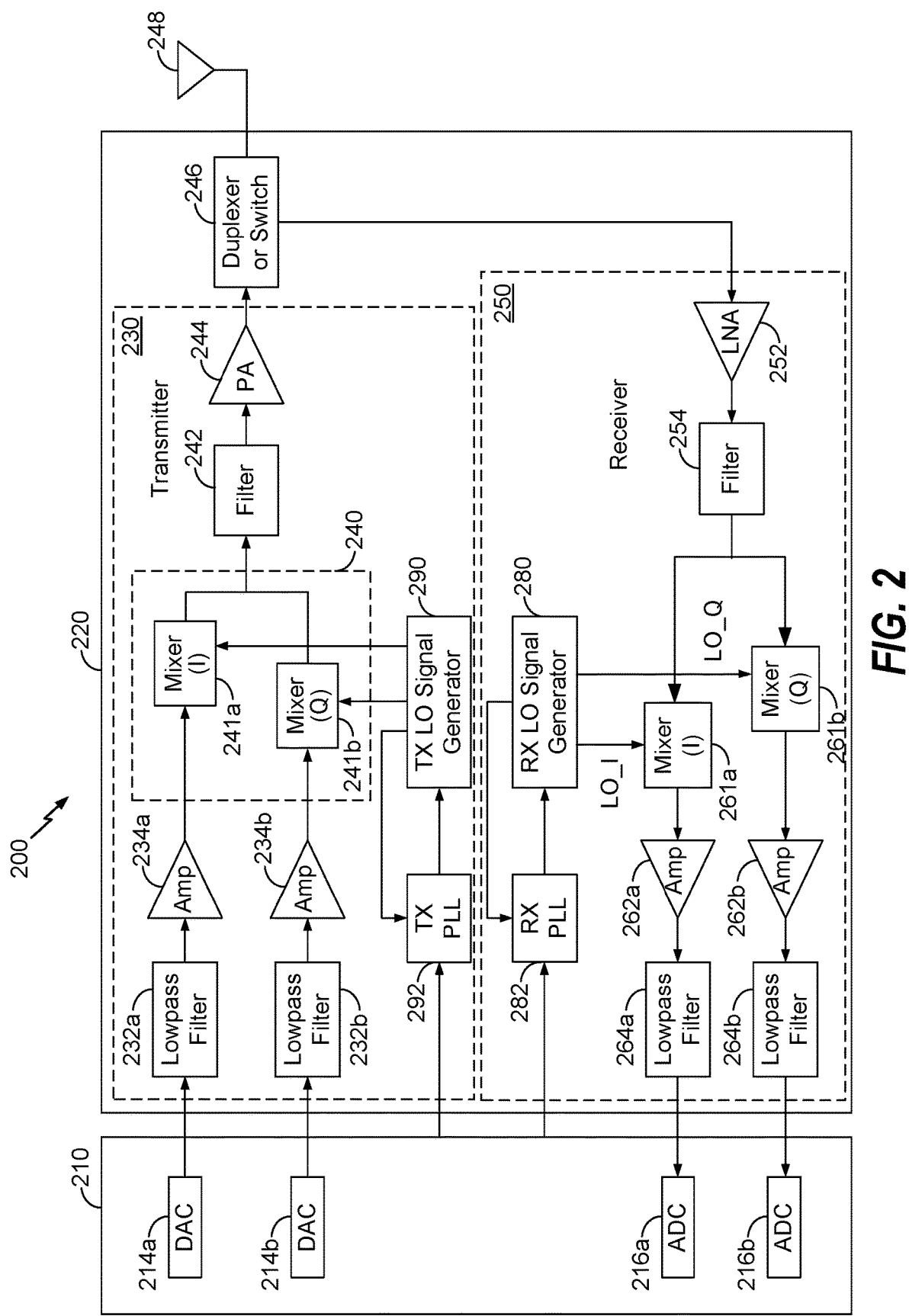
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
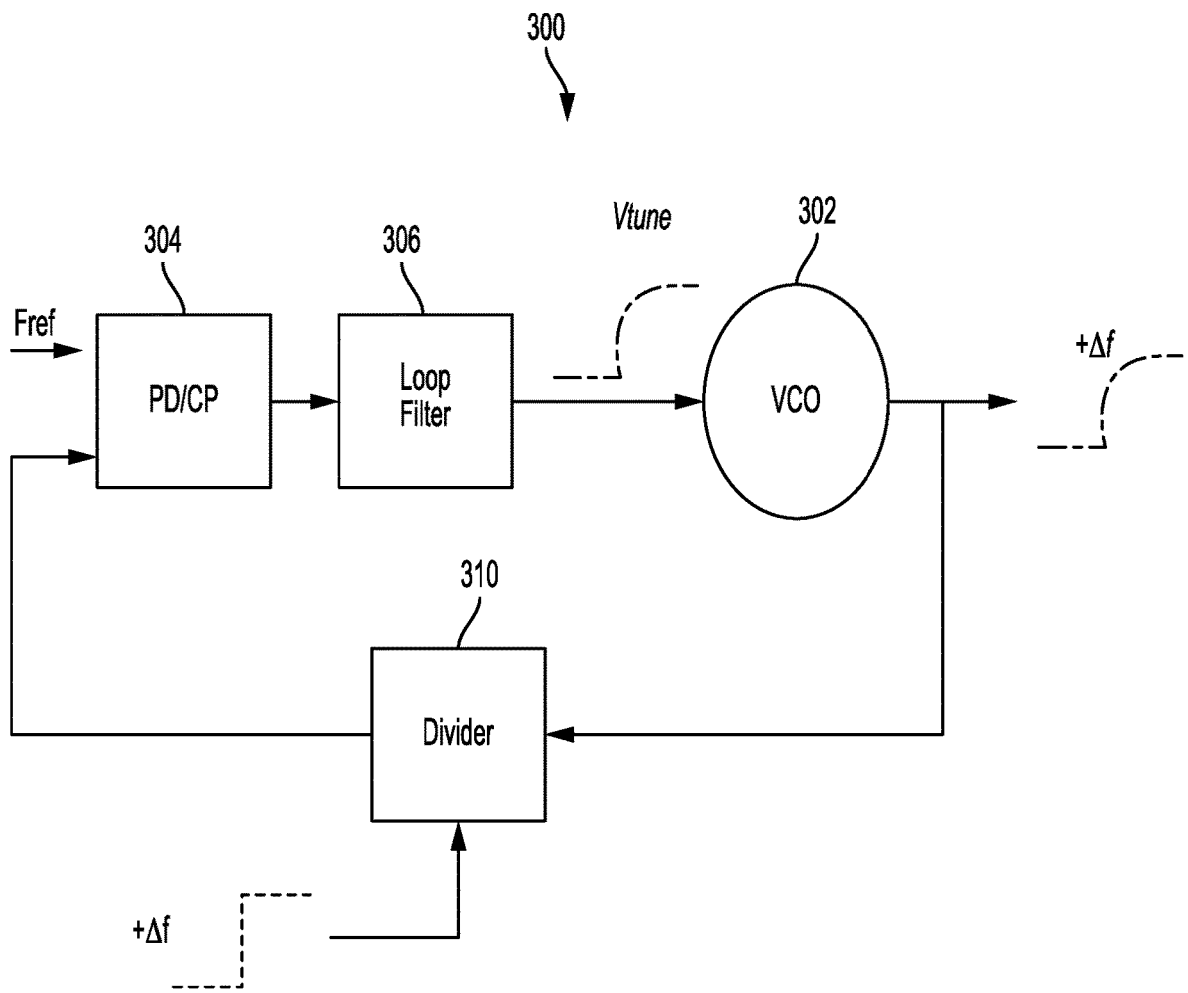
FIG. 3 illustrates a phase lock loop (PLL) system according to aspects of the present disclosure.

FIG. 3 illustrates a phase lock loop (PLL) system 300. The PLL system 300 includes a voltage controlled oscillator (VCO) 302, a phase frequency detector (PFD) 304, a loop filter (e.g., low pass filter) 306, and a frequency divider (e.g., integer-N synthesizer or fractional synthesizer) 310. The PLL system 300 may be integrated in a mobile communication device. For example, the PLL system 300 may be implemented in a radio frequency (RF) module of the mobile communication device.

The phase frequency detector 304 may be coupled to the loop filter 306, the loop filter 306 may be coupled to the VCO 302, the VCO 302 may be coupled to the frequency divider 310, and the frequency divider 310 may be coupled to the phase frequency detector 304 to close a feedback loop. The output of the VCO 302 may be a frequency sinusoid that is controlled by a tuning voltage Vtune, which is received by the VCO 302 from the loop filter 306. For example, changing the tuning voltage Vtune changes the frequency of the VCO 302. To synthesize a desirable or exact frequency of the VCO 302, the output frequency of the VCO 302 is fed back to the frequency divider 310. The phase frequency detector 304 compares an output of the frequency divider 310 with a reference signal (e.g., reference signal Fref). In some aspects, the reference frequency may be generated by a stable local crystal oscillator (not shown).

For example, if the reference frequency of the crystal oscillator is at 40 MHz and the output of the VCO 302 is at 4 GHz, the frequency divider 310 receives the 4 GHz output of the VCO 302. The frequency divider 310 is programmed to divide by 100 to provide an output frequency to the phase frequency detector 304 that matches the reference frequency received at the phase frequency detector 304. The phase frequency detector 304 compares a phase of the reference frequency and the output frequency of the frequency divider 310 and generates an error signal, proportional to a phase difference between the two frequencies. In some implementations, an analog multiplier or mixer can be used as the phase frequency detector 304. Because the reference frequency and the output from the frequency divider are the same when the loop is locked, the output of the phase frequency detector 304 contains a direct current (DC) component and a signal at twice the frequency (e.g., this is true when the phase frequency detector is in the form of a multiplier or mixer). The DC component is proportional to the phase difference. The double frequency component is removed by the loop filter 306. Any phase difference then shows up as a control voltage (e.g., tuning voltage (Vtune)) to the VCO 302 after filtering.

Figure 4:
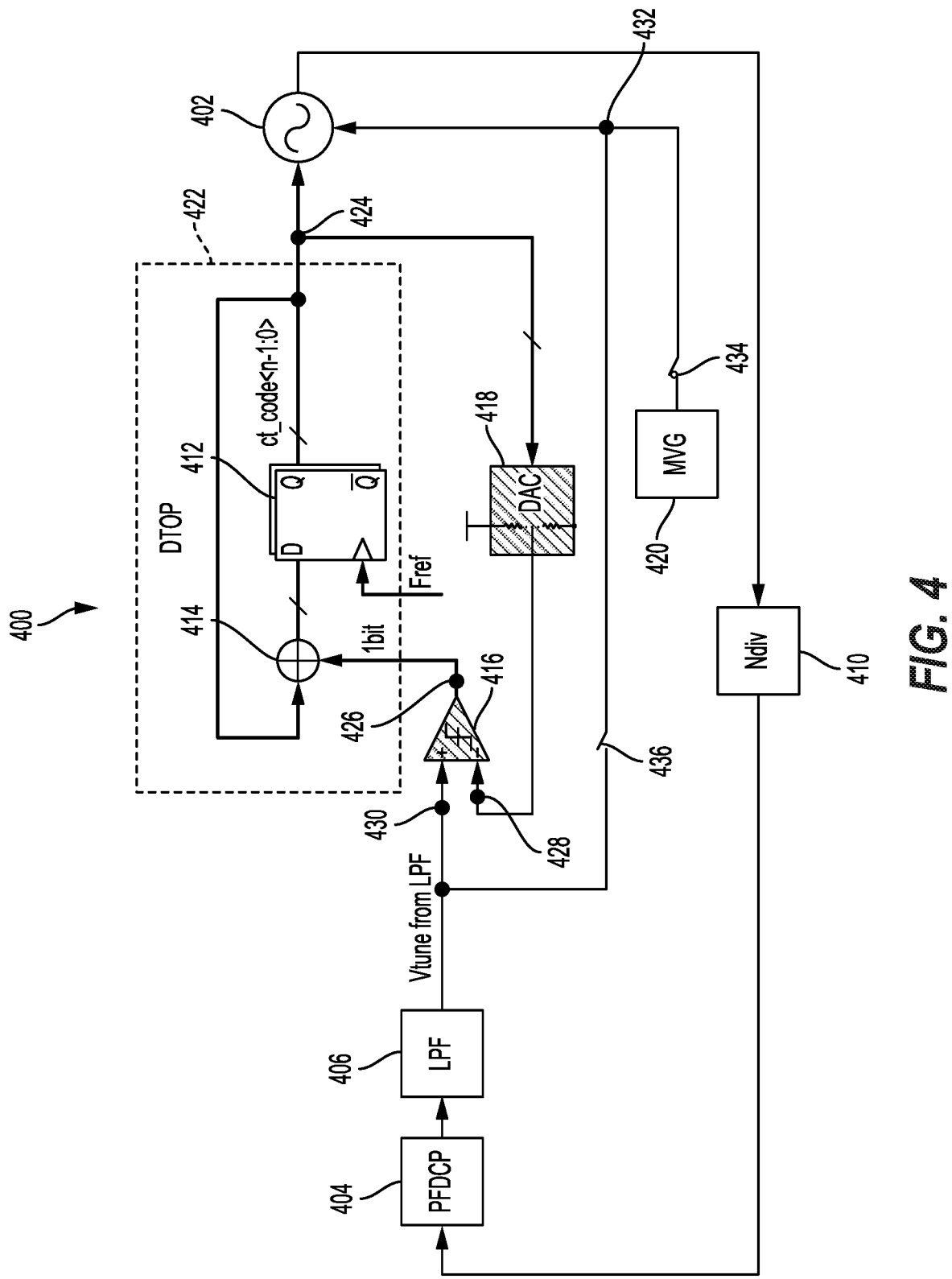
FIG. 4 illustrates a synthesizer, such as a phase lock loop (PLL), for wireless communication to achieve fast coarse tuning based on delta modulation according to aspects of the present disclosure.

FIG. 4 illustrates a fast coarse tuning synthesizer such as a phase lock loop (PLL) system 400 for wireless communication to achieve fast coarse tuning based on delta modulation, according to aspects of the present disclosure. The PLL system 400 may be integrated in a mobile communication device or user equipment. For example, the PLL system 400 may be implemented in a radio frequency (RF) module of the mobile communication device. The PLL system 400 includes a voltage controlled oscillator (VCO) 402, a phase/frequency detector and charge pump (PFDCP) 404, a loop filter (e.g., a low pass filter) 406, a frequency divider (e.g., an integer-N or fractional divider) 410, a digital-to-analog converter (DAC) 418, a comparator 416, a bias generator or fixed voltage bias circuit (e.g., a mid-voltage generator (MVG)) 420, a combiner 414, and a digital control unit (e.g., a digital top (DTOP)) 422. The digital control unit 422 includes flip-flops 412. In some aspects, the combiner 414 may be integrated into the digital control unit 422.

The digital control unit 422 (e.g., an output of the digital control unit 422) is coupled to a first input node 424 of the VCO 402. The digital-to-analog converter 418 is also coupled to the input node 424 of the VCO 402. An output 426 of the comparator 416 is coupled to the digital control unit 422. A first input 428 of the comparator 416 is coupled to the digital-to-analog converter 418. A second input 430 of the comparator 416 is coupled to a second input node 432 of the VCO 402. The bias generator 420 (to generate the fixed voltage bias) is also coupled to the second input node 432 of the VCO 402.

A reference oscillator (not shown) generates a reference signal having a precise frequency of Fref. The PFDCP 404 receives the reference signal (not shown) and a feedback signal from the frequency divider 410, compares phases of the two signals, and provides an error signal that indicates the phase difference/error between the two signals. A charge pump of the PFDCP 404 receives the error signal and generates a current signal (or charge) that is proportional to the error signal. The loop filter 406 filters the current signal to provide a control signal or closed loop tuning voltage (e.g., Vtune).

The coarse tuning (CT) implementation uses the digital-to-analog converter 418, the comparator 416, and the bias generator 420, among others, to quantize an analog fine frequency tuning signal (e.g., the closed loop tuning voltage, Vtune) to achieve fast coarse tuning. In operation, the VCO 402 receives a digital tuning code or VCO frequency code that sets the VCO 402 to an initial coarse tuning frequency range. Coarse tuning to select a desirable frequency range for fine tuning may be achieved in a digital domain (e.g., using digital switching), while the fine tuning may be achieved in an analog and/or digital domain. A first voltage is obtained based on a digital tuning code (e.g., using the digital-to-analog converter 418). The first voltage is compared to the closed loop tuning voltage, Vtune. The comparator 416 receives the first voltage at the first input node 428, receives the closed loop tuning voltage, Vtune, at the second input node 430, and generates an output at the output node 426 of the comparator 416.

The output of the comparator is digitally integrated and the digital tuning code (coarse tuning code) is updated based on the integrating. The digital control unit 422 may receive the reference frequency (Fref) and the updating may also be based on the received reference frequency. The integrating may include summing the output of the comparator 416 with a feedback of the current digital tuning code from the output of the digital control unit 422. For example, the feedback of the digital output code may originate from an output of the flip-flops 412 included in the digital control unit 422. The digital tuning code is updated to change the coarse tuning frequency range of the VCO 402. A final updated digital tuning code corresponds to a coarse tuning frequency range closest to the target frequency for the VCO 402.

In some implementations, the output frequency of the VCO 402 is generated based on the digital tuning code, the fixed voltage bias, and the closed loop tuning voltage. The fixed voltage bias may be provided to the VCO 402 from the bias generator 420, such as a mid-voltage generator (MVG). The fixed voltage bias may be injected to the VCO 402 to bias the VCO to a center of a fine tuning frequency range. In some aspects, biasing and centering the VCO may be achieved with a varactor. For example, a voltage (V) to capacitance (C) transfer function of a varactor has a largest slope when a voltage delta between two terminals across the varactor (or vtune-fixed) is set to a certain value. Therefore, when the fixed voltage bias is set to a certain point, the closed loop tuning voltage, Vtune, is centered to have a maximum or increased delta C, which translates to frequency.

In some aspects, the output of the loop filter 406 may be selectively coupled to a second input of the VCO 402 via the node 432. The selective coupling is achieved via a switch 436. Similarly, the fixed voltage bias from the bias generator 420 may be provided to the second input of the VCO 402 via the node 432. In one aspect, the bias voltage generator 420 is selectively coupled to the node 432 via a switch 434.

Thus, rather than implement an analog counter, the comparator 416 and the digital-to-analog converter 418 may be implemented according to aspects of the present disclosure to achieve fast coarse tuning.

Figure 5:
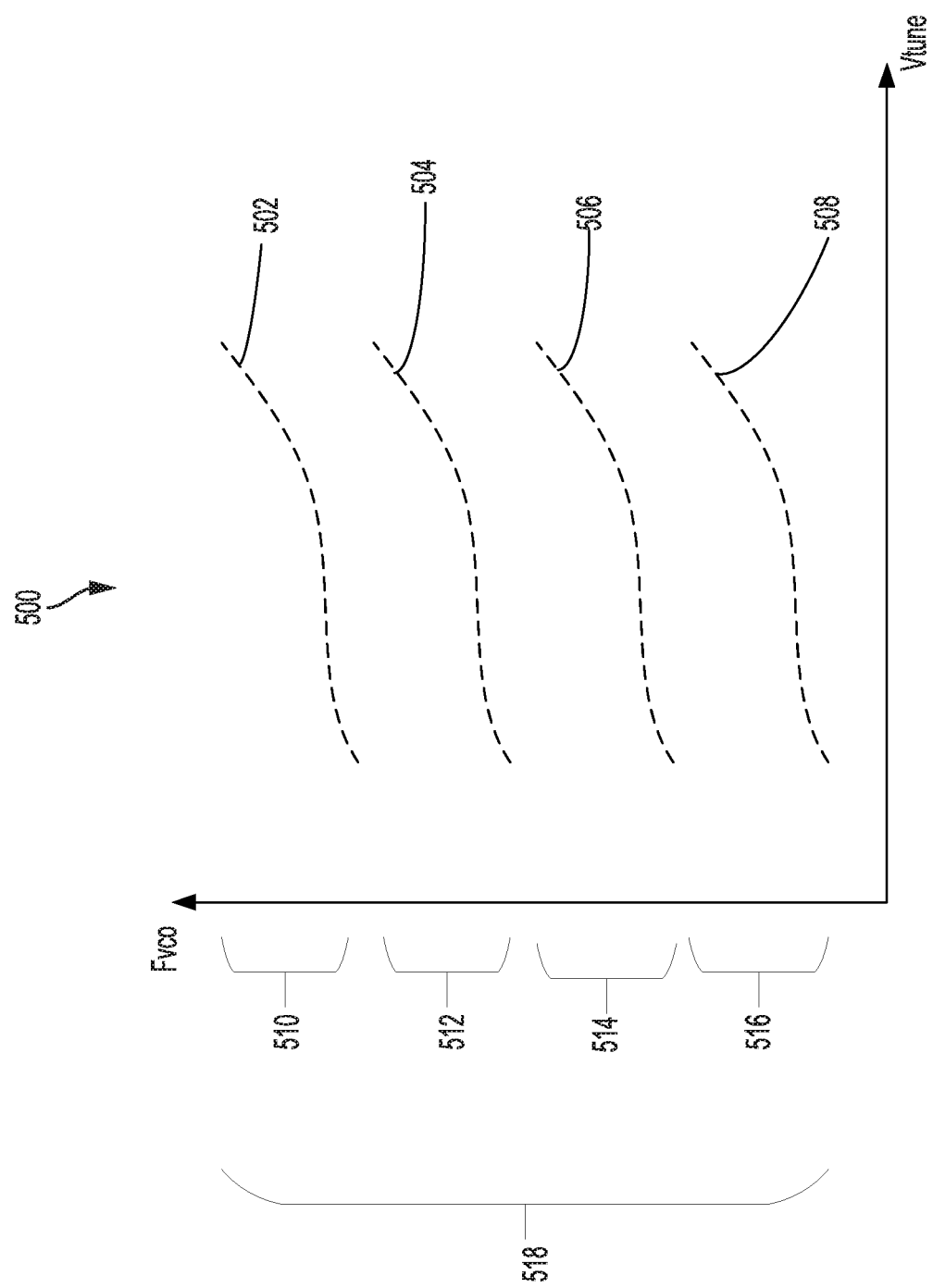
FIG. 5 is an exemplary graph illustrating a coarse tuning operation according to aspects of the present disclosure.

FIG. 5 is an exemplary graph 500 illustrating a coarse tuning operation according to aspects of the present disclosure. An x-axis of the graph 500 represents voltage, such as the closed loop tuning voltage Vtune of the VCO 402. A y-axis of the graph 500 represents frequency (e.g., $F_{VCO}$) of the VCO 402. The graph 500 includes tuning curves 502, 504, 506, and 508. Each tuning curve 502, 504, 506, and 508 represents a fine tuning frequency range. The coarse tuning operation selects the fine tuning frequency range of the VCO 402 by selecting the appropriate tuning curve.

Coarse tuning may operate over a wide tuning range 518. The fine tuning may be implemented over a limited tuning range. For example, the tuning curve 502 represents a fine tuning frequency range 510, the tuning curve 504 represents a fine tuning frequency range 512, the tuning curve 506 represents a fine tuning frequency range 514, and the tuning curve 508 represents a fine tuning frequency range 516. In some aspects, a phase locked loop or synthesizer may have a bandwidth of two (2) to forty (40) gigahertz (GHz), which corresponds to the wide tuning range 518. For example, coarse tuning achieves fast jumping within discrete tuning curves 502, 504, 506, and 508, in which each discrete curve includes a reduced tuning range 510-516. Thus, fine tuning occurs to a fraction of the tuning range.

For example, fine tuning may occur in the tuning curve 506 that is selected based on selection of a coarse tuning code corresponding to the selected tuning curve 506. The closed loop tuning voltage Vtune is adjusted (increased or decreased) to achieve the target frequency. The target frequency may be set by a controller. The voltage and corresponding frequency may be controlled based on analog control to achieve the target frequency. For example, a discrete curve that is closest to the target frequency is selected and the analog tuning is achieved over the frequency range of the selected discrete curve. The bias voltage generator 420 biases the discrete curve at a center to have more margins on both sides of the discrete curve. For example, in the coarse tuning operation, a varactor of the VCO 402 is fixed by the mid-voltage generator while the closed loop tuning voltage Vtune is routed to a coarse tuning bank. The coarse tuning code starts from a mid-point of the coarse tuning range. For example, Vtune is moved along the tuning curve 506 until the target frequency is achieved when the loop is stabilized.

Figure 6:
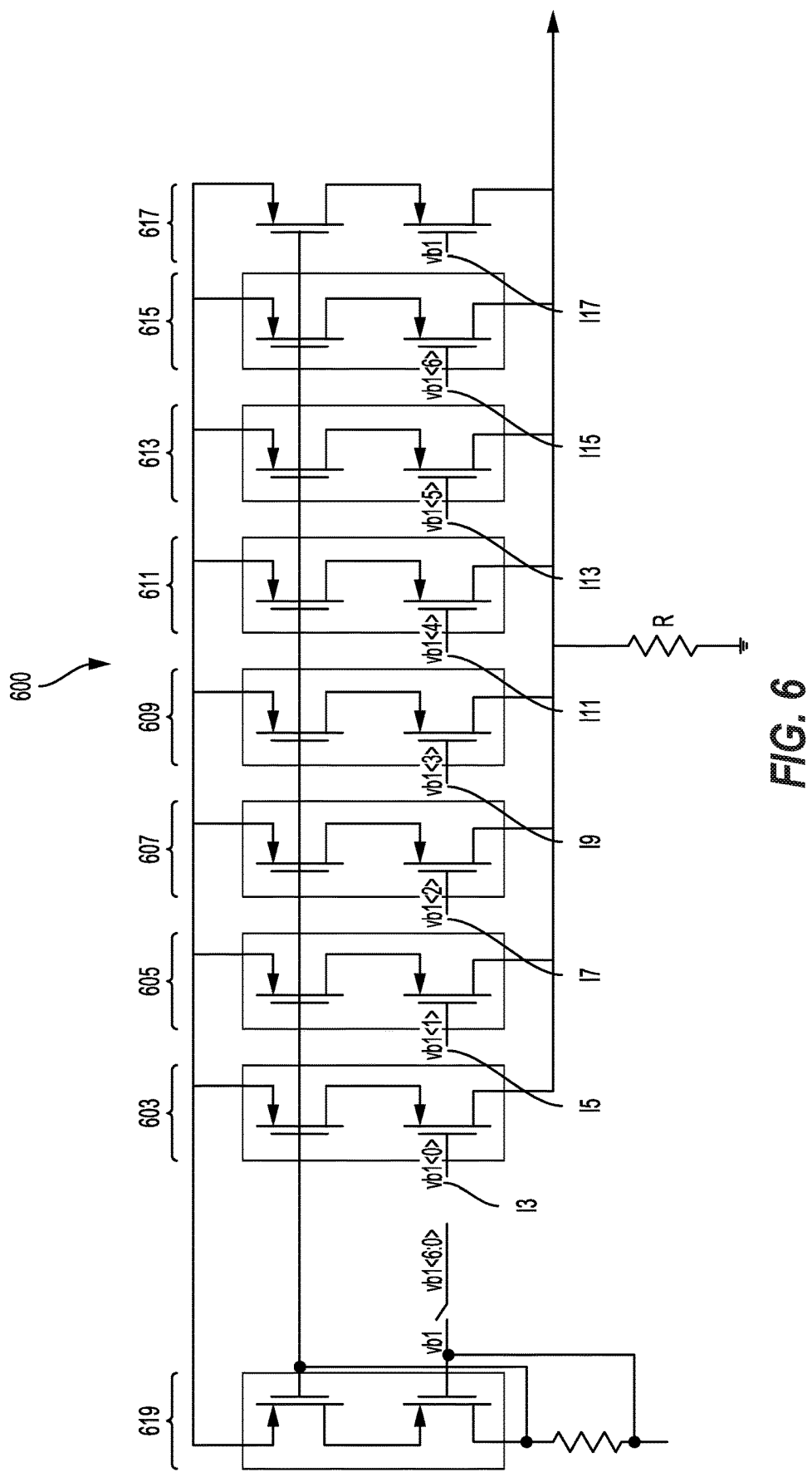
FIG. 6 illustrates a schematic diagram of a digital-to-analog converter used in the synthesizer of FIG. 4 according to aspects of the present disclosure.

FIG. 6 illustrates a schematic diagram of a digital-to-analog converter (DAC) 600 used in the synthesizer shown in FIG. 4, according to aspects of the present disclosure. The DAC 600 may be similar to the digital-to-analog converter 418 of the PLL system 400. The digital-to-analog converter 600 generates a voltage (e.g., the first voltage) from a digital signal (e.g., the digital tuning code). A variety of digital-to-analog converter designs are known, one of which is a current steering digital-to-analog converter. In a current steering digital-to-analog converter, a current having a magnitude corresponding to the value of a digital signal flows through a resistor to generate a voltage having a magnitude corresponding to the digital signal.

The current steering digital-to-analog converter 600 of FIG. 6 uses a resistor R to convert an output current through the resistor R into an output voltage. The output current is generated by current sources 603-617, although a fewer or greater number of current sources can be used. Each of the current sources 603-617 is selectively enabled by respective control signals I1-I17. The current sources 603-617 are coupled in parallel with a mirror reference current source 619. As a result, the current through the current sources 603-617 corresponds to, but is not necessarily equal to, the magnitude of the current through the mirror reference current source 619.

Figure 7:
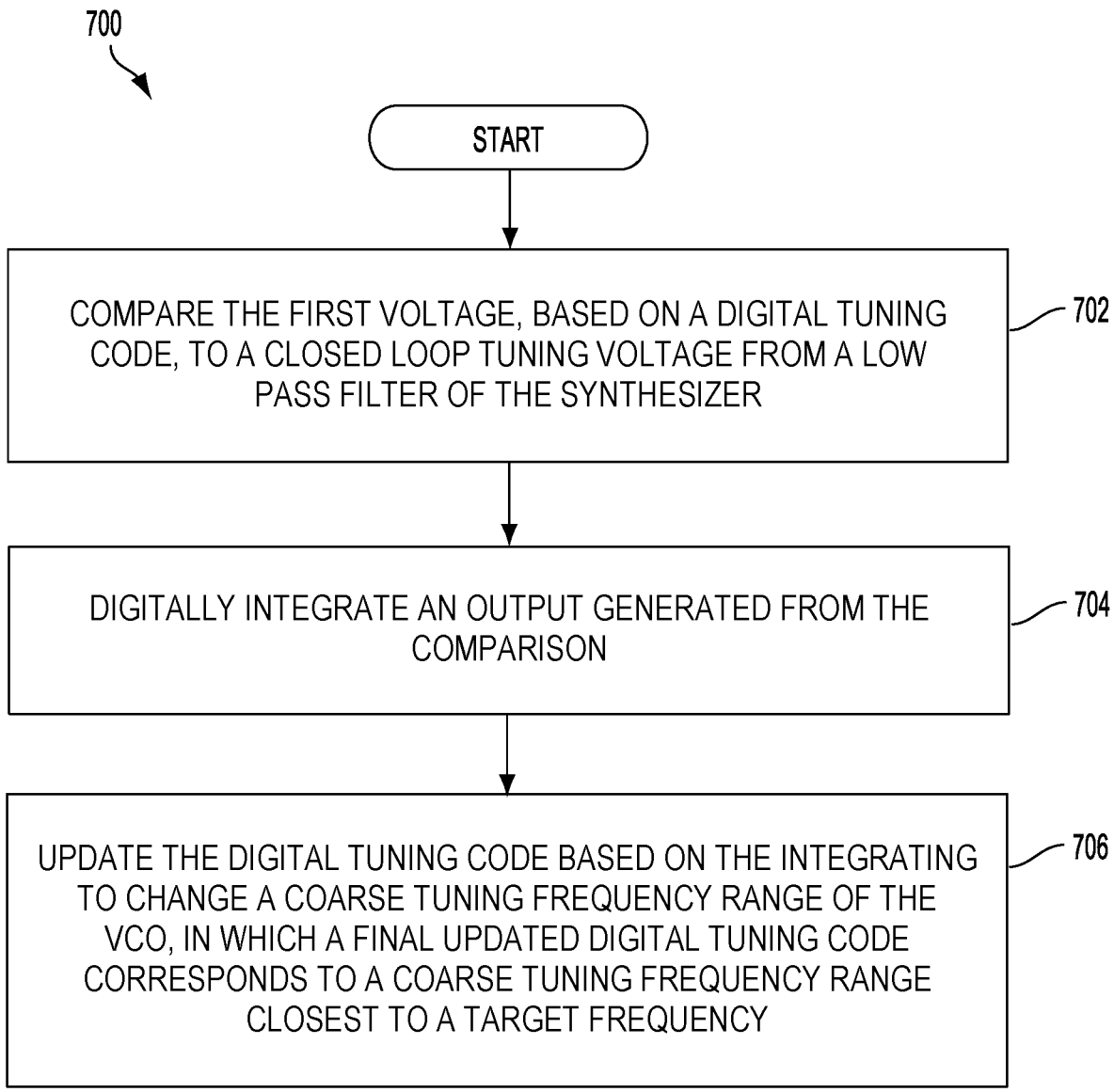
FIG. 7 depicts a simplified flowchart of a delta modulation based fast coarse tuning method for linearizing a phase frequency detector of a phase locked loop according to aspects of the present disclosure.

FIG. 7 depicts a simplified flowchart 700 of a fast coarse tuning method based on delta modulation. The fast coarse tuning method may be implemented with the synthesizer described. At block 702, a first voltage, based on a digital tuning code, is compared to a closed loop tuning voltage from a low pass filter of the synthesizer. For example, a quantized code (e.g., the digital tuning code) may be obtained from the DTOP and provided to a VCO (voltage controlled oscillator) of a synthesizer and to a DAC. The DAC may output the first voltage. At block 704, an output generated from the comparing is digitally integrated. At block 706, the digital tuning code is updated based on the integrating to change a coarse tuning frequency range of the VCO. A final updated digital tuning code corresponds to a coarse tuning frequency range closest to a target frequency.

According to one aspect of the present disclosure, a synthesizer (e.g., PLL) for wireless communication is described. The synthesizer includes means for generating a digital tuning code. The digital tuning code generating means may, for example, may be the digital control unit 422, the combiner 414, and/or the flip-flops 412. In another aspect, the aforementioned means may be any module or any apparatus or material configured to perform the functions recited by the aforementioned means.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed synthesizer. It will be recognized that other devices may also include the disclosed synthesizer, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the synthesizer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A coarse tuning method based on delta modulation comprising:
    comparing a first voltage, based on a digital tuning code, to a closed loop tuning voltage from a low pass filter of a synthesizer;
    digitally integrating an output generated from the comparing by summing the generated output with feedback of the digital tuning code provided to a VCO (voltage controlled oscillator) from a digital control unit; and
    updating the digital tuning code based at least in part on the integrating to change a coarse tuning frequency range of the VCO, in which a final updated digital tuning code corresponds to a coarse tuning frequency range closest to a target frequency.

2. The coarse tuning method of claim 1, further comprising injecting a fixed voltage bias to the VCO to bias the VCO to a center of a fine tuning frequency range.

3. The coarse tuning method of claim 2, further comprising generating an output frequency from the VCO based at least in part on the final updated digital tuning code, the fixed voltage bias and the closed loop tuning voltage.

4. The coarse tuning method of claim 2, in which the injecting further comprises selectively injecting the fixed voltage bias to the VCO to bias the VCO to the center of the fine tuning frequency range.

5. The coarse tuning method of claim 1, further comprising receiving, at the VCO, a digital tuning code that sets the VCO to an initial coarse tuning frequency range.

6. The coarse tuning method of claim 5, in which updating the digital tuning code further comprises updating the digital tuning code from the digital tuning code that sets the VCO to an initial coarse tuning frequency range to a digital tuning code that sets the VCO to an updated coarse tuning frequency range.

7. The coarse tuning method of claim 1, further comprising selectively injecting the closed loop tuning voltage to the VCO to achieve fine tuning within a fine tuning frequency range that is selected based at least in part on the final updated digital tuning code.

8. The coarse tuning method of claim 1, in which the coarse tuning method is based on a delta modulation.

9. A coarse tuning synthesizer for wireless communication comprising:
- a VCO (voltage controlled oscillator) having a first input node configured to set a tuning range of the VCO and a second input node configured to receive a tuning voltage;
- a digital control unit having an output node coupled to the first input node of a VCO
- a digital-to-analog converter having an input coupled to the first input node of the VCO; and
- a comparator comprising an output node coupled to an input node of the digital control unit, a first input node coupled to an output of the digital-to-analog converter and a second input node coupled to an output node of the VCO.

10. The coarse tuning synthesizer of claim 9, further comprising a fixed voltage bias circuit coupled to the second input node of the VCO.

11. The coarse tuning synthesizer of claim 10, further comprising a switch coupled between the fixed voltage bias circuit and the second input node of the VCO, the switch configured to selectively couple the fixed voltage bias circuit to the second input node of the VCO.

12. The coarse tuning synthesizer of claim 10, further comprising a switch coupled between the output node of the VCO and the second input node of the VCO, the switch configured to selectively couple a closed loop tuning voltage to the second input node of the VCO.

13. The coarse tuning synthesizer of claim 10, further comprising a combiner between the output node of the comparator and the input node of the digital control unit, the combiner configured to combine a feedback from the output node of the digital control unit and an output generated by the comparator.

14. The coarse tuning synthesizer of claim 10, further comprising a combiner between the VCO and the fixed voltage bias circuit, the combiner configured to combine a closed loop tuning voltage and a fixed voltage bias from the fixed voltage bias circuit.

15. A coarse tuning synthesizer for wireless communication comprising:
- a VCO (voltage controlled oscillator) having a first input node configured to set a tuning range of the VCO and a second input node configured to receive a tuning voltage,
- means for generating a digital tuning code, the digital tuning code generating means coupled to the first input node of the VCO;
- a digital-to-analog converter having an input coupled to the first input node of the VCO; and
- a comparator comprising an output node coupled to the digital tuning code generating means, a first input node coupled to an output of the digital-to-analog converter and a second input node coupled to an output node of the VCO.

16. The coarse tuning synthesizer of claim 15, further comprising a fixed voltage bias circuit coupled to the second input node of the VCO.

17. The coarse tuning synthesizer of claim 16, further comprising means for switching coupled between the fixed voltage bias circuit and the second input node of the VCO, the switching means for selectively coupling the fixed voltage bias circuit to the second input node of the VCO.

18. The coarse tuning synthesizer of claim 16, further comprising means for switching coupled between the output node of the VCO and the second input node of the VCO, the switching means for selectively coupling a closed loop tuning voltage to the second input node of the VCO.

19. The coarse tuning synthesizer of claim 16, further comprising combining means between the output node of the comparator and the digital tuning code generating means, the combining means for combining a feedback from the digital tuning code generating means and an output generated by the comparator.

20. The coarse tuning synthesizer of claim 16, further comprising combining means between the VCO and the fixed voltage bias circuit, the combining means for combining a closed loop tuning voltage and a fixed voltage bias from the fixed voltage bias circuit.

* * * * *